United States Patent
Sicard

[19]

[11] Patent Number: 5,936,390
[45] Date of Patent: Aug. 10, 1999

[54] CONTROL CIRCUIT

[75] Inventor: Thierry Sicard, Cugnaux, France

[73] Assignee: Motorola, Inc., Schaumburg, Ill.

[21] Appl. No.: 09/008,997

[22] Filed: Jan. 20, 1998

[30] Foreign Application Priority Data

Mar. 14, 1997 [FR] France .................................. 97 03087

[51] Int. Cl.$^6$ .............................. G05F 1/40; H01F 17/00
[52] U.S. Cl. ........................ 323/282; 323/284; 323/351
[58] Field of Search .................................... 323/282, 284, 323/285, 351, 315, 317

[56] References Cited

U.S. PATENT DOCUMENTS

| 3,671,767 | 6/1972 | Davis ........................................ 307/116 |
| 4,692,688 | 9/1987 | Stanojevic ................................ 323/285 |
| 4,758,773 | 7/1988 | Fushimi et al. ......................... 323/351 |
| 4,887,022 | 12/1989 | Gontowski ................................ 323/284 |
| 5,195,016 | 3/1993 | Powers ..................................... 323/351 |
| 5,796,276 | 8/1998 | Phillips et al. ......................... 323/317 |

FOREIGN PATENT DOCUMENTS

| 0706266 | 9/1995 | European Pat. Off. ........ H03K 17/30 |
| 3837821 | 11/1988 | Germany ......................... H03K 17/30 |
| 2088161 | 11/1980 | United Kingdom . |

OTHER PUBLICATIONS

"A 70 MΩ Intelligent High Side Switch With Full Diagnostics", Gariboldi et al., IEEE Journal of Solid–State Circuits, vol. 31, No. 7, Jul. 1996, pp. 915–923, XP000632376.

*Primary Examiner*—Peter S. Wong
*Assistant Examiner*—Rajnikant B. Patel
*Attorney, Agent, or Firm*—Sharon K. Coleman

[57] ABSTRACT

A control circuit for controlling a current switch to provide current to a load circuit, includes a hysteresis trigger circuit arranged to selectively switch on the current switch in dependence upon a control signal. A transistor is arranged to selectively provide an operating current to the hysteresis trigger circuit in dependence upon the control signal. In this way operating current is only supplied to the hysteresis trigger circuit when the control signal is high, such that the load circuit does not draw current when the control signal is low.

6 Claims, 1 Drawing Sheet

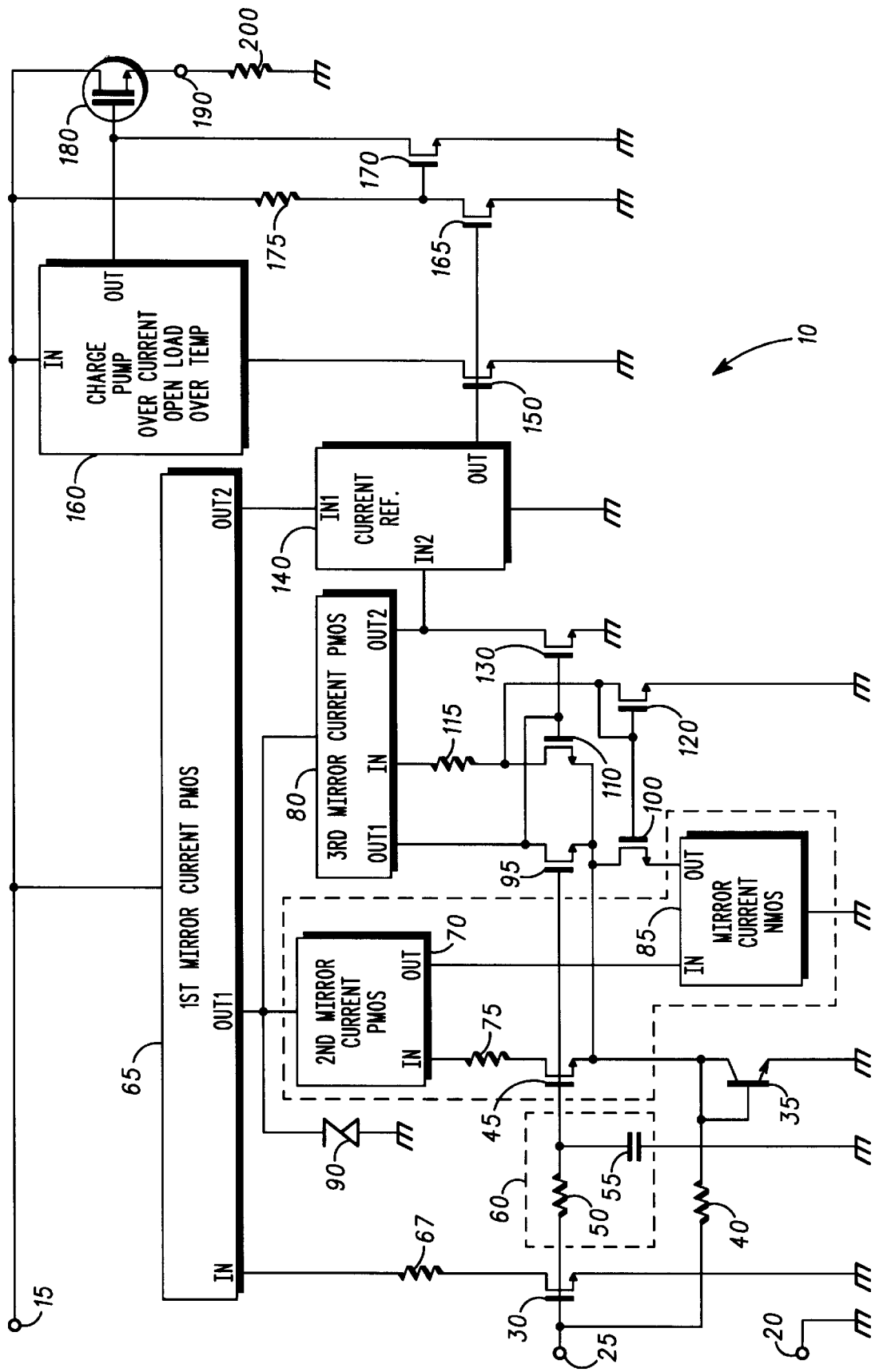

CONTROL CIRCUIT

FIELD OF THE INVENTION

This invention relates to control circuits, and particularly but not exclusively to control circuits for use with automotive component control applications.

BACKGROUND OF THE INVENTION

In the automotive industry, relays have been used to provide a switched connection between components and the battery of a vehicle. In the past, relays did not drain the battery when components were switched off.

With the desire to remove the relay and to have components directly connected to the battery, typically a microcontroller is used to control components such as switches. A problem with such an arrangement is that high side switches (switches connected to the battery), have a control circuit also supplied by the battery. In general the control circuit requires a small dc current to bias some components and this always gives rise to a small but finite standby current drawn by these components when they are switched off.

There is a need to decrease battery drain, and it is therefore desired to reduce standby current, without increasing the number of discrete components again by reverting to relays.

Furthermore automotive manufacturers continue to increase the number of electrically powered devices provided in a vehicle, thereby increasing the number of components which are directly connected to the battery. This compounds the current drain, making the problem even worse.

This invention seeks to provide a control circuit which mitigates the above mentioned disadvantages.

SUMMARY OF THE INVENTION

According to the present invention there is provided a control circuit for controlling a current switch to provide current to a load circuit, comprising: a hysteresis trigger circuit, coupled to selectively switch on the current switch in dependence upon a control signal; and, a transistor coupled to selectively provide an operating current to the hysteresis trigger circuit in dependence upon the control signal; wherein operating current is only supplied to the hysteresis trigger circuit when the control signal has a predetermined value, such that the load circuit does not draw current in when the control signal does not have the predetermined value.

In this way the control circuit ensures that substantially no current is drawn from the battery when the load circuit is in standby mode.

BRIEF DESCRIPTION OF THE DRAWING(S)

An exemplary embodiment of the invention will now be described with reference to the single FIGURE drawing which shows a preferred embodiment of a control circuit in accordance with the invention.

DETAILED DESCRIPTION OF A PREFERRED EMBODIMENT

Referring to the single FIGURE drawing there is shown a control circuit 10 arranged to be coupled between a battery (not shown) and a load circuit 200.

A battery input terminal 15 of the control circuit 10 is coupled to a positive terminal of the battery (not shown) for receiving a battery voltage Vbat. A ground terminal 20 is coupled to the ground terminal of the battery. A control input terminal 25 is coupled to a receive a control signal to be described below.

A first NMOS (N-doped Metal Oxide Semiconductor) transistor 30 has a control electrode coupled to the control input terminal 25 and first and second conducting electrodes, the second conducting electrode being coupled to the ground terminal 20.

A first bipolar transistor 35 has a control electrode coupled via a first resistor 40 of 200 KOhms to the control input terminal 25, a first conducting electrode coupled to the control electrode of the same transistor and a second conducting electrode coupled to the ground terminal 20.

A second NMOS transistor 45 has a control electrode coupled via a second resistor 50 of 200 KOhms to the control input terminal 25 and via a capacitor 55 to the ground terminal 20, and first and second conducting electrodes, the second conducting electrode being coupled to the first conducting electrode of the first bipolar transistor 35. The second resistor 50 and the capacitor 55 form an RC filter 60.

A first P-MOS (P-doped Metal Oxide Semiconductor) current mirror 65 has an input coupled to the first conducting electrode of the first NMOS transistor 30 via a third resistor 67 of 200 KOhms, first and second outputs, and a further terminal coupled to the battery input terminal 15.

A second P-MOS current mirror 70 has an input coupled via a fourth resistor 75 to the first conducting electrode of the second NMOS transistor 45, an output, and a further terminal coupled to the first output of the first P-MOS current mirror 65.

A third P-MOS current mirror 80 has an input, first and second outputs and a further terminal coupled to the first output of the first P-MOS current mirror 65.

A first N-MOS current mirror 85 has an input coupled to the output of second P-MOS current mirror 70, an output, and a further terminal coupled to the ground terminal 20.

A clamping diode 90 is coupled between the first output of the first PMOS current mirror 65 and the ground terminal 20.

A third NMOS transistor 95 has a control electrode coupled via the second resistor 50 to the control input terminal 25 and via the capacitor 55 to the ground terminal 20, a first conducting electrode coupled to the first output of the third PMOS current mirror 80, and a second conducting electrode coupled to the first conducting electrode of the first bipolar transistor 35.

A fourth NMOS transistor 100 has a control electrode, a first conducting electrode coupled to the first conducting electrode of the first bipolar transistor 35, and a second conducting electrode coupled to the output of the first NMOS current mirror 85.

A fifth NMOS transistor 110 has a control electrode coupled to the first output of the third PMOS current mirror 80, a first conducting electrode coupled via a fifth resistor 115 to the input of the third PMOS current mirror 80, and a second conducting electrode coupled to the first conducting electrode of the first bipolar transistor 35.

A sixth NMOS transistor 120 has a control electrode and a first electrode coupled together, these being further coupled to the control electrode of the fourth NMOS transistor 100 and to the input of the third PMOS current mirror 80 via the fifth resistor 115, and a second conducting electrode coupled to the ground terminal 20.

A seventh NMOS transistor 130 has a control electrode coupled to the first output of the third PMOS current mirror 80, a first conducting electrode coupled to the second output of the third PMOS current mirror 80, and a second conducting electrode coupled to the ground terminal 20.

A current reference circuit 140 has a first input coupled to the second output of the first PMOS current mirror 65, a second input coupled to the second output of the third PMOS current mirror 80, an output, and a further terminal coupled to the ground terminal 20.

An eighth NMOS transistor 150 has a control electrode coupled to the output of the current reference circuit 140, a first conducting electrode, and a second conducting electrode coupled to the ground terminal 20.

A charge pump circuit 160 has an input coupled to the battery input terminal, an output, and a further terminal coupled to the first conducting electrode of the eighth NMOS transistor 150.

A tenth NMOS transistor 170 has a control electrode coupled to the first conducting electrode of the ninth NMOS transistor 165, a first conducting electrode, and a second conducting electrode coupled to the ground terminal 20.

A power MOS transistor 180 has a control electrode coupled to the output of the charge pump circuit 160, a first conducting electrode coupled to the battery input terminal 15 and a second conducting electrode coupled to the load circuit 200 via an output terminal 190.

In operation, the control circuit 10 has two modes, determined by the voltage of the control signal provided to the control input terminal 25. When the function of the load circuit 200 is not required, the control signal voltage is arranged to be below the turn-on voltage threshold of the first NMOS transistor 30 and the control circuit is in a standby mode.

In the standby mode the first, second and third NMOS transistors 30, 45 and 95 respectively are all turned off (non-conducting). The first NMOS transistor 30 therefore does not provide a conductive path to the input of the first PMOS current mirror 65, such that this current mirror is effectively switched off and no current is drawn from the battery input terminal 15.

Since the first PMOS current mirror 65 is switched off, the second and third PMOS current mirrors 70 and 80 respectively are also off, as they receive their respective inputs from the first output of the first PMOS current mirror 65.

Similarly the first NMOS current mirror 85 and the current reference circuit 140 will be off for the same reasons, as they receive outputs from the first, second and third PMOS current mirrors.

The eighth and ninth NMOS transistors 150 and 165 are also switched off. Therefore the charge pump circuit 160 and hence the power MOS transistor 180 are also off. Neither they, nor the sixth resistor 175 draw any current from the battery input terminal 15.

The third NMOS transistor 95 is the key triggering transistor. When the control signal 25 is low the third NMOS transistor 95 is turned off. In the stand-by mode the NMOS 110 is also in turned off. During the stand-by mode no current flows in either transistor.

The seventh NMOS transistor 130 is the key triggering output transistor. In stand-by mode the seventh NMOS transistor 130 is in an off state and the output current of the third PMOS current mirror 80 and the first PMOS current mirror 65 are low, because the first NMOS transistor 30 is off. The eighth and ninth NMOS transistors 150 and 165 are off, so the tenth NMOS transistor 170 is on. In the stand-by mode the first bipolar transistor 35 is not biased because the input voltage 25 is 0V.

The NMOS 170 is the only transistor turned on during the stand-by mode. No current flows in the resistor 175, so the gate of the tenth NMOS transistor 170 is biased with the Vbat voltage 15. The fact that the tenth NMOS transistor 170 is on means that the gate of the power MOS transistor 180 will be 0V, such that the voltage at the output terminal 190 is 0V.

The second, active mode is commenced when the function of the load circuit 200 is required. The control signal voltage is toggled to a level above the turn-on voltage threshold of the first NMOS transistor 30. The first, second and third NMOS transistors 30, 45 and 95 respectively are all turned on.

In this mode the first NMOS transistor 30 provides a conductive path to the input of the first PMOS current mirror 65, switching on the current mirror. The second and third PMOS current mirrors 70 and 80 respectively are also switched on, as they receive their respective inputs from the first output of the first PMOS current mirror 65.

Similarly the first NMOS current mirror 85 and the current reference circuit 140 will switched on, as they receive the now active outputs from the first, second and third PMOS current mirrors.

The eighth and ninth NMOS transistors 150 and 165 are also switched on. Therefore the charge pump circuit 160 triggers the power MOS transistor 180, and current is drawn through the load circuit 200.

When the control input signal 25 is high (5V) the first bipolar transistor 35 is biased through the first resistor 40. This direct drive of the first bipolar transistor 35 results in a minimum delay time between a change in the control input signal 25 from low to high and the voltage change across the voltage across the first bipolar transistor 35.

The RC filter 60 delays the control input signal 25 to ensure that the source voltage of the second NMOS transistor 45 changes before the gate voltage. The second NMOS transistor 45 will then turn on when the input voltage reaches the Vt of NMOS 45 plus the VBE of the first bipolar transistor 35. As the second and third NMOS transistors 45 and 95 have their gate-source terminals in parallel the second NMOS 45 turns on the second PMOS transistor 70 and the first NMOS transistor 85 mirror current.

This pulls down the source of the fourth NMOS transistor 100 to 0V. When the source of the fourth NMOS transistor 100 is 0 it forms a mirror with the sixth NMOS transistor 120. As the first output of the third PMOS current mirror 80 is a current source with high impedance, when the third NMOS transistor 95 is turned on, the drain decrease to the source voltage.

The gate-source voltage of the fifth NMOS transistor 110 is 0V and this transistor is therefore turned off, increasing the drain voltage and biasing the sixth NMOS transistor 120, which forms a mirror with the fourth NMOS transistor 100.

When the fourth NMOS transistor 100 is turned on together with the first NMOS current mirror 85, the collector to emitter voltage of the first bipolar transistor 35 is shorted, so the sources of the second, third and fifth NMOS transistors 45, 95 and 110 are pulled down to 0V creating a hysteresis condition and confirming the active state.

When the third NMOS transistor 95 is turned on, the seventh NMOS transistor 130 is turned off, such that the output source current from the third PMOS current mirror 80 injects a very low current in the current reference just to start the current reference circuit 140. This current reference turns on the eighth and ninth NMOS transistors 150 and 165. The eighth NMOS transistor 150 supplies the charge pump circuit 160 to give to the gate a voltage 10V greater than vbat, The ninth NMOS transistor 165 turns off the tenth NMOS transistor 170 to allow the gate of the power NMOS 180 to reach Vbat plus 10V given by the charge pump circuit 160.

In this way stable on and off states are achieved, in dependence upon the control input signal, with no battery current drain during the off state.

It will be appreciated that alternative embodiments to the one described above are possible. For example, the arrangement and type of transistors described above could be modified.

I claim:

1. A control circuit for controlling a current switch to provide current to a load circuit, comprising:

a hysteresis trigger circuit, coupled to selectively switch on the current switch in dependence upon a control signal; and a field effect transistor coupled to selectively provide an operating current to the hysteresis trigger circuit in dependence upon the control signal;

wherein the hysteresis trigger circuit includes a bipolar transistor having a control electrode connected both to a control electrode of the field effect transistor, via a resistor, to be directly driven by the control signal, and to other parts of the hysteresis circuit for providing a reference voltage thereto, and wherein operating current is only supplied to the hysteresis trigger circuit when the control signal has a predetermined value, such that the load circuit does not draw current in when the control signal does not have the predetermined value.

2. The control circuit of claim 1 wherein the hysteresis trigger circuit comprises a charge pump circuit coupled to provide operating current to the current switch.

3. The control circuit of claim 2 wherein the hysteresis trigger circuit comprises at least one current mirror circuit arranged to selectively provide a reference current to operate the charge pump circuit in dependence upon the control signal.

4. The control circuit of claim 1 wherein the current switch is a power transistor.

5. The control circuit of claim 2 wherein the current switch is a power transistor.

6. The control circuit of claim 3 wherein the current switch is a power transistor.

* * * * *